(12) United States Patent
Arai et al.

(10) Patent No.: US 8,023,277 B2
(45) Date of Patent: Sep. 20, 2011

(54) ELECTRONIC COMPONENT INTEGRATED MODULE

(75) Inventors: Yoshiyuki Arai, Kyoto (JP); Hideki Takehara, Hyogo (JP)

(73) Assignee: Panasonic Corporation, Osaka (JP)

( * ) Notice: Subject to any disclaimer, the term of this patent is extended or adjusted under 35 U.S.C. 154(b) by 977 days.

(21) Appl. No.: 11/712,904

(22) Filed: Mar. 2, 2007

(65) Prior Publication Data

US 2007/0216039 A1    Sep. 20, 2007

(30) Foreign Application Priority Data

Mar. 2, 2006  (JP) ................................. 2006-055922

(51) Int. Cl.
*H05K 7/02* (2006.01)
*H05K 7/06* (2006.01)
*H05K 7/08* (2006.01)
*H05K 7/10* (2006.01)

(52) U.S. Cl. ......... 361/760; 361/764; 361/766; 174/523

(58) Field of Classification Search .......... 361/760–766; 174/264, 520–523; 257/700–774, 787–794
See application file for complete search history.

(56) References Cited

U.S. PATENT DOCUMENTS

| | | | | |
|---|---|---|---|---|
| 5,264,065 A * | 11/1993 | Kohm | | 156/307.4 |
| 6,479,167 B2 | 11/2002 | Sumita et al. | | |
| 6,724,094 B2 * | 4/2004 | Kosokabe | | 257/794 |
| 6,780,674 B2 | 8/2004 | Sumita et al. | | |
| 6,998,532 B2 * | 2/2006 | Kawamoto et al. | | 174/521 |
| 7,394,663 B2 * | 7/2008 | Yamashita et al. | | 361/766 |
| 7,544,727 B2 * | 6/2009 | Ikezawa et al. | | 523/451 |

FOREIGN PATENT DOCUMENTS

| | | |
|---|---|---|
| JP | 10-079453 | 3/1998 |
| JP | 2001-023968 | 1/2001 |
| JP | 2001-288340 | 10/2001 |
| JP | 2002-190564 A | 7/2002 |
| JP | 2002-208668 A | 7/2002 |
| JP | 2003-183351 | 7/2003 |
| JP | 2004-143466 | 5/2004 |
| JP | 2005-144522 | 6/2005 |
| JP | 2005-167100 | 6/2005 |

(Continued)

OTHER PUBLICATIONS

Japanese Office Action, with English translation, issued in Japanese Patent Application No. 2006-055922, mailed Jul. 7, 2009.

(Continued)

*Primary Examiner* — Tuan T Dinh
(74) *Attorney, Agent, or Firm* — McDermott Will & Emery LLP

(57) ABSTRACT

The electronic component integrated module includes a wiring board; an electronic component provided on the wiring board; solder for electrically connecting the electronic component onto the wiring substrate; and an encapsulating resin for encapsulating the electronic component and the solder. The average linear thermal expansion coefficient α of the encapsulating resin, which is calculated by using the glass transition temperature of the encapsulating resin, a linear thermal expansion coefficient α1 obtained at a temperature lower than the glass transition temperature, a linear thermal expansion coefficient α2 obtained at a temperature exceeding the glass transition temperature, room temperature, and a peak temperature of reflow packaging of the electronic component integrated module, is not less than $17 \times 10^{-6}/°C$ and not more than $110 \times 10^{-6}/°C$.

11 Claims, 4 Drawing Sheets

FOREIGN PATENT DOCUMENTS

JP    2005-197422    7/2005

OTHER PUBLICATIONS

Japanese Office Action, with English translation, issued in Japanese Patent Application No. 2006-055922, mailed May 26, 2009.

Japanese Decision to Dismiss Amendment, with English Translation, issued in Japanese Patent Application No. 2006-055922, mailed Oct. 13, 2009.

Japanese Decision of Rejection, with English Translation, issued in Japanese Patent Application No. 2006-055922, mailed Oct. 13, 2009.

* cited by examiner

SOLDER WETTED AREA

ELECTRONIC COMPONENT INTEGRATED MODULE

CROSS-REFERENCE TO RELATED APPLICATIONS

This application claims priority under 35 U.S.C. §119 on Patent Application No. 2006-55922 filed in Japan on Mar. 2, 2006, the entire contents of which are hereby incorporated by reference.

BACKGROUND OF THE INVENTION

The present invention relates to an electronic component integrated module and a method for fabricating an electronic component integrated module, and more particularly, it relates to an electronic component integrated module in which an electronic component is encapsulated with a resin and a method for fabricating the same.

Recently, in accordance with reduction in the size and weight of electronic equipment such as a cellular phone and a data communication terminal, there are increasing demands for reduction in the size and weight of module products included in the electronic equipment. In such a module product, an IC chip (a semiconductor device) and a chip component (a surface mount electronic component) are provided on a substrate with an epoxy adhesive, and the IC chip and the chip component are encapsulated with an encapsulating resin for protection (see, for example, Japanese Laid-Open Patent Publication No. 2002-190564).

Such a module product is provided on electronic equipment through secondary packaging reflow on a mother board (a packaging substrate) of the electronic equipment. Herein, a method of packaging a module product on a mother board of electronic equipment or the like with solder is designated as "secondary packaging reflow", and a method of providing an IC chip or the like on a substrate with solder in fabrication of a module product is designated simply as "packaging reflow". In some cases, solder included in the module product may be re-melted during the secondary packaging reflow, which may cause a failure such as short-circuit. The short-circuit seems to be caused as follows: When the solder is re-melted, melting expansion pressure is caused in the solder, and a space is formed between the upper face of the chip component and the encapsulating resin by the melting expansion pressure. Therefore, the re-melted solder flows into the space in the form of flush, so as to connect end terminals of the chip component.

In order to solve this problem, use of a low-stress resin as the encapsulating resin has been proposed (see, for example, Japanese Laid-Open Patent Publication No. 2002-208668). According to the description of Japanese Laid-Open Patent Publication No. 2002-208668, when a low-stress resin is used as the encapsulating resin, the melting expansion pressure caused in the re-melting of solder is reduced, resulting in preventing a space from being formed between the upper face of the chip component and the encapsulating resin.

Furthermore, in order to meet recent demands for reduction in cost and weight of electronic equipment, substrates used in module products have been changed from ceramic wiring boards to organic wiring boards. When an organic wiring board is used, however, the moisture absorption of the substrate is increased as compared with the case where a ceramic wiring board is used. Therefore, it is apprehended that the organic wiring board absorbs moisture of the air during the fabrication or storage of the module product, and thus, the reflow resistance and the humidity resistance of the module product are degraded.

Moreover, when a voltage is applied between terminals (electrodes) of the chip component, the solder may migrate between the terminals of the chip component, and in such a case, short-circuit is disadvantageously caused between the terminals of the chip component.

SUMMARY OF THE INVENTION

The electronic component integrated module of this invention includes a wiring board; an electronic component provided on the wiring board; solder for electrically connecting the electronic component onto the wiring board; and an encapsulating resin provided on the wiring board for encapsulating the electronic component and the solder, and an average linear thermal expansion coefficient $\alpha$ of the encapsulating resin calculated by the following Formula 1 is not less than $17 \times 10^{-6}/°C$. and not more than $110 \times 10^{-6}/°C$.:

$$\alpha = \{\alpha 1 \times (Tg-Tr) + \alpha 2 \times (Tp-Tg)\}/(Tp-Tr) \quad \text{Formula 1}$$

wherein $\alpha 1$ indicates a linear thermal expansion coefficient of the encapsulating resin obtained at a temperature lower than a glass transition temperature thereof; $\alpha 2$ indicates a linear thermal expansion coefficient of the encapsulating resin obtained at a temperature exceeding the glass transition temperature; Tg indicates the glass transition temperature of the encapsulating resin; Tr indicates room temperature; and Tp indicates a peak temperature of packaging of the electronic component integrated module.

The method for fabricating an electronic component integrated module of this invention includes a connecting step of electrically connecting an electronic component onto a wiring board with solder; a cleaning step of generating plasma by using a gas including at least one of oxygen and argon and cleaning a surface of the wiring board with the plasma; and an encapsulating step of providing an encapsulating resin on the wiring board for encapsulating the electronic component and the solder, and an average linear thermal expansion coefficient $\alpha$ calculated by the following Formula 1 of the encapsulating resin used in the encapsulating step is not less than $17 \times 10^{-6}/°C$. and not more than $110 \times 10^{-6}/°C$.:

$$\alpha = \{\alpha 1 \times (Tg-Tr) + \alpha 2 \times (Tp-Tg)\}/(Tp-Tr) \quad \text{Formula 1}$$

wherein $\alpha 1$ indicates a linear thermal expansion coefficient of the encapsulating resin obtained at a temperature lower than a glass transition temperature thereof; $\alpha 2$ indicates a linear thermal expansion coefficient of the encapsulating resin obtained at a temperature exceeding the glass transition temperature; Tg indicates the glass transition temperature of the encapsulating resin; Tr indicates room temperature; and Tp indicates a peak temperature of packaging of the electronic component integrated module.

Herein, the packaging means a process for packaging the electronic component integrated module on a packaging substrate or the like.

DETAILED DESCRIPTION OF THE INVENTION

Figure 5A:
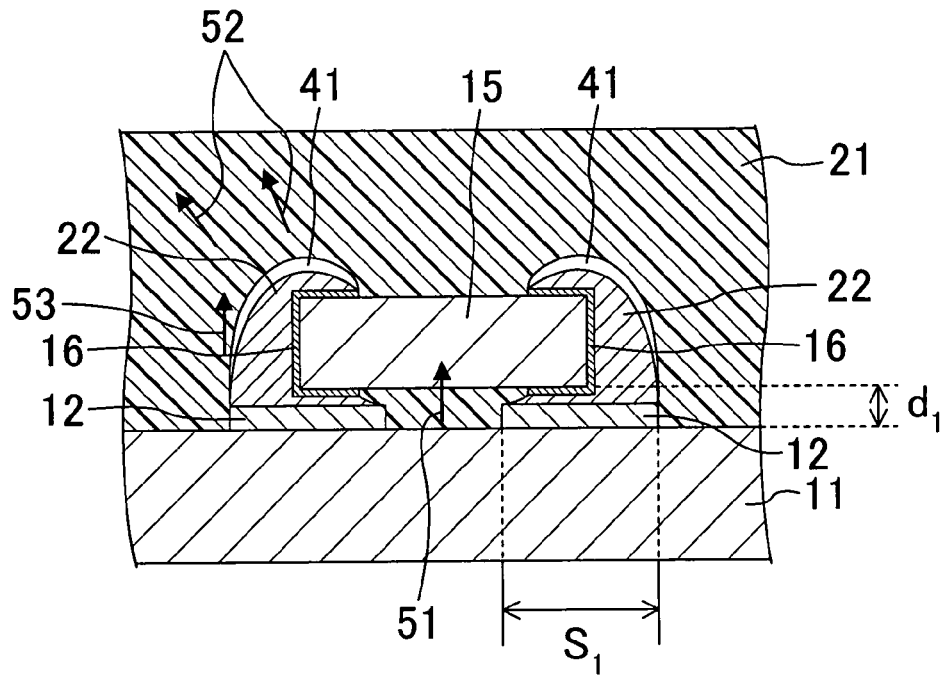
FIG. 5A is a cross-sectional view for showing a state of a comparative electronic component integrated module attained during the secondary packaging reflow.
Figure 5B:
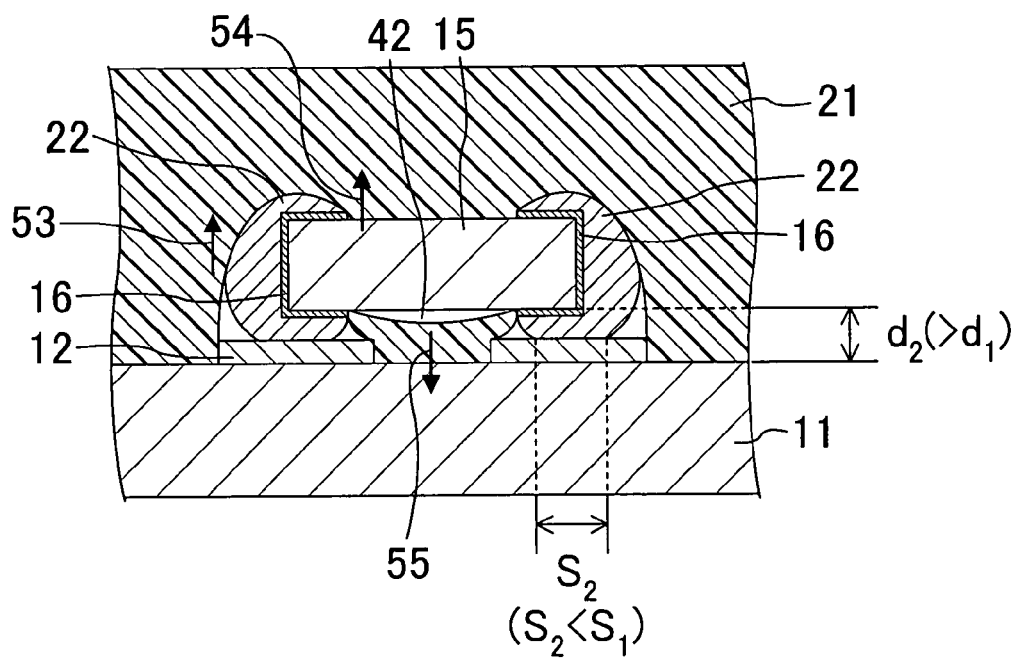
FIG. 5B is a cross-sectional view for showing a state of the comparative electronic component integrated module attained after the secondary packaging reflow.

When a module product is provided on a mother board of electronic equipment through the secondary packaging reflow, the following problems occur:

The problems will be described with reference to FIGS. 5A and 5B. FIG. 5A is a schematic diagram for showing a state of an electronic component integrated module attained during the secondary packaging reflow, and FIG. 5B is a schematic diagram for showing a state of the electronic component integrated module attained after the secondary packaging reflow.

Before the secondary packaging reflow, a chip component 15 is fixed on lands 12 of an organic wiring board 11 with solder 22. When the temperature of the secondary packaging reflow is increased up to the melting point of the solder 22, the solder 22 is re-melted, and as a result, the chip component 15 is placed in a state where it is not fixed on the organic wiring board 11.

When the temperature of the secondary packaging reflow is further increased, an encapsulating resin 21 is thermally expanded along directions shown with arrows 51 and 52 in FIG. 5A. Since the encapsulating resin 21 is thermally expanded along the direction of the arrow 51 of FIG. 5A, the chip component 15 is moved upward as shown with an arrow 54 in FIG. 5B. In other words, a distance $d_2$ between the lower face of the chip component 15 and the upper face of the organic wiring board 11 becomes larger than a distance $d_1$ attained before the secondary packaging reflow.

Furthermore, since the encapsulating resin 21 is thermally expanded along the direction of the arrow 52 of FIG. 5A, a space 41 is formed between the solder 22 and the encapsulating resin 21, and the re-melted solder moves to the space 41 in a direction along an arrow 53 of FIG. 5A. Therefore, the shape of the solder 22 is changed as shown in FIG. 5B, and as a result, an area (wetted area) $S_2$ where the solder 22 is in contact with the land 12 becomes smaller than a wetted area $S_1$ attained before the secondary packaging reflow.

Thereafter, in accordance with the lowering of the temperature of the secondary packaging reflow after the peak, the re-melted solder is set up again at the melting point. As a result, the chip component 15 is fixed in a higher position than the position attained before the secondary packaging reflow as shown in FIG. 5B. This phenomenon in which the chip component 15 is lifted up is hereinafter designated as the lift phenomenon. Also, the solder 22 is set up with the wetted area reduced as shown in FIG. 5B. Accordingly, the strength of connection between the solder 22 and the land 12 is lowered as compared with that attained before the secondary packaging reflow.

Moreover, the extent of the lift of the chip component 15 obtained in setting up the solder 22 again is in proportion to the extent of thermal expansion of the encapsulating resin 21 obtained through temperature increase from room temperature to the melting point of the solder 22. Also after fixing the chip component 15 again, the encapsulating resin 21 is thermally shrunk until the temperature is lowered to room temperature, and therefore, shrinkage stress is caused along a direction shown with an arrow 55 in FIG. 5B in the encapsulating resin 21 filled between the lower face of the chip component 15 and the upper face of the organic wiring board 11.

Furthermore, since the organic wiring board 11 absorbs more moisture than a ceramic wiring board, vaporization expansion of the moisture invading from the organic wiring board 11 degrades adhesiveness obtained on the interface between the organic wiring board 11 and the encapsulating resin 21 and adhesiveness obtained on the interface between the chip component 15 and the encapsulating resin 21. As a result, interfacial delamination 42 may be caused as shown in FIG. 5B.

Through the above-described mechanism, various problems occur, and for example, disconnection of solder is caused in a temperature cycle test, a repeated bending test or the like, or a leakage or short-circuit derived from the interfacial delamination is caused in a THB test (temperature humidity bias test), a PCT (pressure cooker test) or the like.

The present invention was devised to solve the aforementioned problems, and an object of the invention is providing an electronic component integrated module with reliability improved by preventing the reduction of a wetted area of solder and the occurrence of interfacial delamination derived from the lift phenomenon of a chip component otherwise occurring after the secondary packaging reflow of electronic equipment.

Now, a preferred embodiment of the invention will be described with reference to the accompanying drawings. In the drawings mentioned below, like reference numerals are used to refer to like elements so as to omit description. Also, chip components and electrode terminals of an IC chip are shown in smaller numbers than their actual numbers so that the drawings can be more easily understood.

An electronic component integrated module according to an embodiment of the invention is to be provided on a packaging substrate of electronic equipment or the like through the secondary packaging reflow. In this embodiment, the electronic component integrated module will be described by exemplifying an organic wiring board as a wiring board and exemplifying a surface mount electronic component in the shape of a chip (hereinafter referred to as the chip component) as an electronic component. It is noted that the chip component is at least one of a capacitor, a resistor and a coil.

Figure 1:
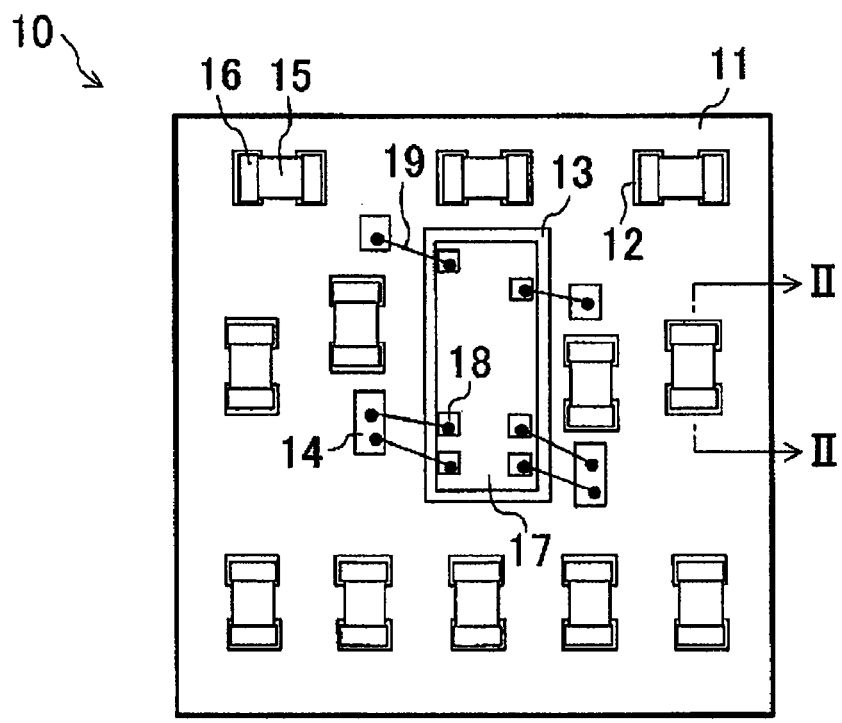
FIG. 1 is a plan view of an electronic component integrated module according to an embodiment of the invention.
Figure 2:
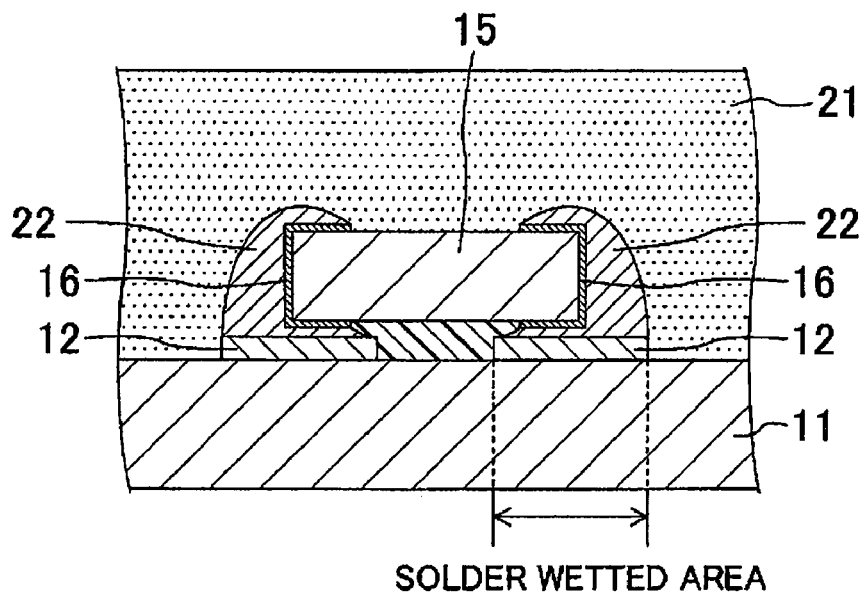
FIG. 2 is a cross-sectional view taken on line II-II of FIG. 1

FIG. 1 is a plan view for showing the structure of the electronic component integrated module 10 of this embodiment. FIG. 2 is a cross-sectional view taken on line II-II of FIG. 1. In FIG. 1, the electronic component integrated module 10 is shown with an encapsulating resin 21 removed so as to be easily understood.

The electronic component integrated module 10 includes, as shown in FIG. 1, an organic wiring board 11, chip components 15 and an IC chip 17. On the upper face of the organic wiring board 11, lands 12, a die pad 13 and connection terminals 14 are provided, and a terminal electrode 16 of each chip component 15 is disposed on each land 12 with solder 22 provided therebetween, and the IC chip 17 is disposed on the die pad 13 with the solder 22 provided therebetween. It is noted that a plurality of IC chips may be provided on the die pad 13. Also, the connection terminals 14 are electrically connected respectively to device electrodes (electrode portions) 18 of the IC chip 17 through bonding wires 19. The chip components 15, the IC chip 17, the bonding wires 19 and the solder 22 are encapsulated with the encapsulating resin 21.

The organic wiring board 11 may be a substrate obtained by curing glass fiber or organic fiber such as Kevlar impregnated with an epoxy resin, a phenol resin, BT resin or the like, or may be any of various kinds of resin substrates including a tape-shaped substrate of a polyimide resin or the like. In this embodiment, the BT resin is used.

A metal thin film (ex.: a gold thin film) is formed on the lands 12 and the die pad 13. Thus, corrosion of the lands 12 and the die pad 13 can be prevented, and soldering or wire bonding onto the lands 12 can be stably performed.

As the encapsulating resin 21, a resin that is not largely thermally expanded during the secondary packaging reflow, can be rigidly adhered onto the chip component 15 and the organic wiring board 11 so as not to peel off from them, and can prevent the occurrence of the lift phenomenon is preferably used.

Now, the encapsulating resin 21 will be described in detail.

In Table 1 below, average linear thermal expansion coefficients $\alpha$, land wet ratios and interfacial delamination occurrence rates of resins A through G each used as an encapsulating resin of an electronic component integrated module are listed.

recently widely used is 210° C. through 250° C., and hence, the peak temperature Tp is properly assumed to be 240° C. through 280° C.

Each land wet ratio listed in Table 1 is a value obtained by surface grinding the corresponding electronic component integrated module so as to expose solder after the secondary packaging reflow, taking a photograph of the electronic component integrated module through X-ray non-destructive internal observation, measuring a solder wetted area based on the photograph and dividing the solder wetted area by the area of the land.

Also, each interfacial delamination occurrence rate listed in Table 1 corresponds to a fraction defective obtained through observation of the cross-section of the lower face of a chip component after the secondary packaging reflow, and specifically, the denominator corresponds to the number of test samples and the numerator corresponds to the number of test samples having the interfacial delamination.

For measuring the land wet ratio and the interfacial delamination occurrence rate of Table 1, each test sample of the

TABLE 1

|  | Resin A | Resin B | Resin C | Resin D | Resin E | Resin F | Resin G |
|---|---|---|---|---|---|---|---|
| Content of filler (wt %) | 75 | 75 | 70 | 70 | 65 | 60 | 30 |
| Glass transition temperature (° C.) | 44 | 35 | 94 | 74 | 80 | 120 | 116 |
| Linear thermal expansion coefficient $\alpha1$ ($\times 10^{-6}$/° C.) | 19 | 18 | 24 | 19 | 23 | 30 | 52 |
| Linear thermal expansion coefficient $\alpha2$ ($\times 10^{-6}$/° C.) | 65 | 70 | 91 | 94 | 102 | 120 | 195 |
| Average linear thermal expansion coefficient $\alpha$ ($\times 10^{-6}$/° C.) | 61.3 | 67.8 | 71.3 | 78.4 | 82.7 | 83.6 | 139.6 |
| Elastic coefficient (MPa) 25° C. | 2500 | 4000 | 9000 | 9000 | 6500 | 4000 | 900 |
| 260° C. | 20 | 30 | 100 | 90 | 70 | 60 | 20 |
| Land wet ratio (%) | 95.0 | 93.9 | 87.5 | 86.1 | 86.5 | 84.6 | 82.8 |
| Interfacial peeling occurrence rate | 0/48 | 0/48 | 0/48 | 0/48 | 0/48 | 1/48 | 2/48 |

The average linear thermal expansion coefficient $\alpha$ is defined by the following formula 1:

$$\alpha = \{\alpha1 \times (Tg-Tr) + \alpha2 \times (Tp-Tg)\}/(Tp-Tr) \quad \text{Formula 1}$$

wherein $\alpha1$ indicates a linear thermal expansion coefficient of the corresponding encapsulating resin obtained at a temperature lower than its glass transition temperature; $\alpha2$ indicates a linear thermal expansion coefficient of the encapsulating resin obtained at a temperature exceeding the glass transition temperature; Tg indicates the glass transition temperature of the encapsulating resin; Tr indicates room temperature; and Tp indicates a general peak temperature of the secondary packaging reflow.

Each average linear thermal expansion coefficient $\alpha$ listed in Table 1 is calculated by assuming in Formula 1 that the room temperature Tr is 25° C. and that the peak temperature Tp is 260° C. It is noted that the room temperature Tr is not limited to 25° C. but may be any temperature not lower than 20° C. and not higher than 30° C., and that the peak temperature Tp is not limited to 260° C. but may be any temperature not lower than 240° C. and not higher than 280° C. This is because the average linear thermal expansion coefficient $\alpha$ is not largely varied even when the temperatures Tr and Tp are varied respectively in the aforementioned ranges. For example, with respect to the resin A listed in Table 1, the average linear thermal expansion coefficient $\alpha$ calculated with the temperatures Tr and Tp respectively set in the aforementioned ranges has the maximum value of $61.9 \times 10^{-6}$/° C. and the minimum value of $60.0 \times 10^{-6}$/° C., which is different from a value listed in Table 1, that is, $61.3 \times 10^{-6}$/° C., by $1.3 \times 10^{-6}$/° C. at most. The melting point of lead-free solder electronic component integrated module is subjected to a preliminary treatment. As the preliminary treatment, the electronic component integrated module is stored in a constant humidity chamber of a temperature of 85° C. and a humidity of 65% RH for 12 hours, is then subjected to the reflow (corresponding to the packaging reflow) with a peak temperature set to 260° C., is stored in a constant humidity chamber of a temperature of 85° C. and a humidity of 65% RH for 12 hours again, and is subjected to the reflow (corresponding to the secondary packaging reflow) with a peak temperature set to 260° C.

As shown in Table 1, with respect to the resin G having an average linear thermal expansion coefficient $\alpha$ of $139.6 \times 10^{-6}$/° C., the land wet ratio is 82.8%, the connection area between the solder 22 and the land 12 is reduced through the secondary packaging reflow, and the interfacial delamination of the lower face of the chip component occurs in 2 samples out of 48 evaluation samples.

With respect to the resin F having an average linear thermal expansion coefficient $\alpha$ of $83.6 \times 10^{-6}$/° C., the land wet ratio is 84.6%, and the interfacial delamination of the lower face of the chip component occurs in 1 sample out of 48 evaluation samples. It is understood from the evaluation results of the resins F and G that the lift phenomenon of the chip component can be improved by using the resin F as compared with the case where the resin G is used.

The average linear thermal expansion coefficients $\alpha$ listed in Table 1 are measured values. The actual characteristics of resins are varied, and the average linear thermal expansion coefficient $\alpha$ obtained in consideration of the characteristic variation is not less than $116.8 \times 10^{-6}$/° C. and not more than 142.1×10$^{-6}$/° C. with respect to the resin G and not less than 63.4×10$^{-6}$/° C. and not more than 104.7×10$^{-6}$/° C. with respect to the resin F. Accordingly, it is understood that the lift phenomenon can be improved by using, as the encapsulating resin, a resin with an average linear thermal expansion coefficient α of 110.0×10$^{-6}$/° C. or less.

Furthermore, as shown in Table 1, with respect to the resins A through E each having an average linear thermal expansion coefficient α of 82.7×10$^{-6}$/° C. or less, the interfacial delamination occurrence rate is 0%.

As described above, it is confirmed that the occurrence of the lift phenomenon can be suppressed by reducing the average linear thermal expansion coefficient α. As one of methods for reducing the average linear thermal expansion coefficient α, the content of filler included in the encapsulating resin may be increased. However, it is necessary to knead an inorganic filler and a liquid resin for performing the resin encapsulation by a printing method described below, and when the content of filler is too large, the inorganic filler cannot be uniformly dispersed in the liquid resin. Therefore, from the viewpoint of preparation of the encapsulating resin, the content of the inorganic filler in the resin is preferably 90 wt % or less. When the content of the inorganic filler is 90 wt %, the average linear thermal expansion coefficient α of the resultant resin is 16.7×10$^{-6}$/° C.

Accordingly, the average linear thermal expansion coefficient α of the encapsulating resin 21 is preferably not less than 17×10$^{-6}$/° C. and not more than 110×10$^{-6}$/° C. in consideration of a margin.

Moreover, in the case where the resin encapsulation is performed by the printing method described below, it is significant to improve the flowability of the encapsulating resin 21 and the shape stability of the encapsulating resin 21. As the content of the inorganic filler is larger, the viscosity of the encapsulating resin 21 is higher, and hence the flowability of the encapsulating resin is degraded. Therefore, it is difficult to completely fill such a resin in a fine space (such as a space between the chip component 15 and the organic wiring board 11) without forming a void. On the other hand, when the content of the inorganic filler in the encapsulating resin 21 is small, the viscosity of the encapsulating resin 21 is lowered and hence the flowability of the encapsulating resin 21 is improved but the shape stability of the encapsulating resin 21 attained after performing the printing method is lowered. In other words, the shape of the encapsulating resin 21 cannot be kept after the encapsulation and the encapsulating resin 21 spreads beyond a printing region, namely, what is called sagging is caused. This degrades the working efficiency.

The viscosity of the encapsulating resin 21 for attaining sufficient flowability and sufficient shape stability is not less than 50 Pa·s and not more than 100 Pa·s, and the average linear thermal expansion coefficient α attained with such viscosity is not less than 44×10$^{-6}$/° C. and not more than 77×10$^{-6}$/° C.

Accordingly, in order to suppress the occurrence of the lift phenomenon, the average linear thermal expansion coefficient α of the encapsulating resin 21 is preferably not less than 16.7×10$^{-6}$/° C. and not more than 110.0×10$^{-6}$/° C., and in order to suppress the occurrence of the lift phenomenon and improve the workability of the printing encapsulation, the average linear thermal expansion coefficient α is more preferably not less than 44×10$^{-6}$/° C. and not more than 77×10$^{-6}$/° C.

Figure 3:
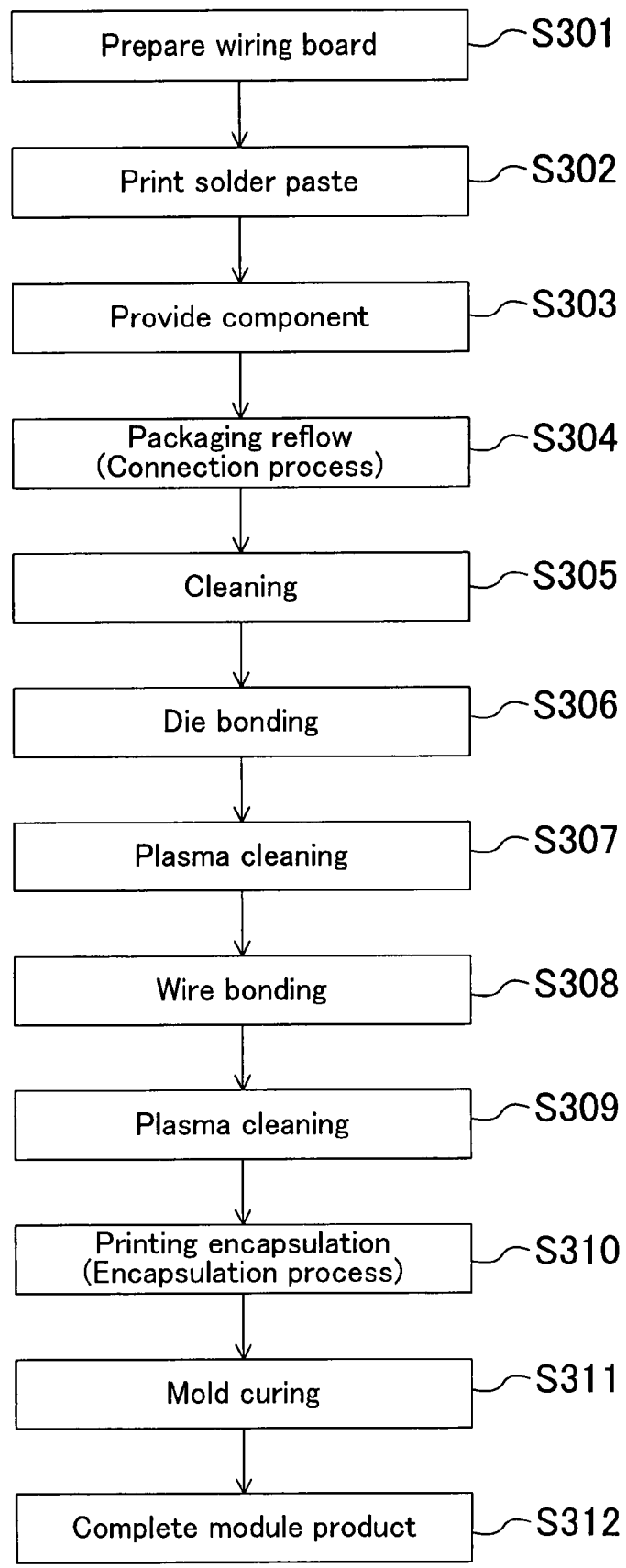
FIG. 3 is a flowchart for showing exemplified fabrication procedures for the electronic component integrated module of the embodiment.

FIG. 3 is a flowchart of the fabrication of the electronic component integrated module of this embodiment.

First, in step S301, an organic wiring board 11 having lands 12 and a die pad 13 thereon is prepared.

Next, in step S302, a solder paste is supplied onto the lands 12 of the organic wiring board 11 by using a metal mask and a squeegee by a printing method.

Subsequently, in step S303, a plurality of chip components 15 such as a capacitor, a resistor and a coil are respectively provided on the lands 12.

Then, in step S304, terminal electrodes 16 of the respective chip components 15 are connected to the lands 12 with solder through the packaging reflow. At this point, the solder material may be, for example, a Sn—Ag—Cu-based material or a Sn—Sb-based material. Furthermore, each terminal electrode 16 is preferably plated with, for example, Sn or Au.

Next, in step S305, the organic wiring board 11 having the chip components 15 thereon is cleaned with a cleaning fluid, so that contaminants such as organic substances can be removed from the organic wiring board 11, the chip components 15 and spaces between the organic wiring board 11 and the chip components 15 contaminated in step S304. An example of the contaminants such as organic substances is flux included in the solder paste.

Then, in step S306, an IC chip 17 is aligned in a position corresponding to the die pad 13, and the IC chip 17 is adhesively fixed on the die pad 13 with, for example, an epoxy adhesive including a silver filler. In this step, the organic wiring board 11 is annealed at a temperature of, for example, approximately 175° C. for curing the adhesive. Through this annealing, an organic solvent or the like is outgassed from the organic wiring board 11 and the adhesive, and hence, the surfaces of the organic wiring board 11, connection terminals 14 and device terminals 18 of the IC chip 17 are contaminated with the outgas.

Subsequently, in step S307, plasma cleaning is performed by using, for example, a gas including at least one of oxygen and argon, so as to remove the contaminants (derived from, for example, the outgas) present on the surfaces of the organic wiring board 11, the connection terminals 14 and the device electrodes 18 of the IC chip 17. Thus, the contaminants that cannot be removed in step S305 and the contaminants caused in step S306 can be both removed.

Next, in step S308, the device electrodes 18 of the IC chip 17 are respectively electrically connected to the connection terminals 14 of the organic wiring board 11 with bonding wires 19. As the bonding wires 19, a gold wire is preferably used. Since the contaminants have been removed from the surfaces of the device electrodes 18 and the connection terminals 14 through the plasma cleaning, the strength of connection between the bonding wires 19 and the device electrodes 18 or the connection terminals 14 can be increased.

Then, in step S309, the plasma cleaning is performed by using, for example, a gas including at least one of oxygen and argon, so as to roughen the surface of the organic wiring board 11 or the surface of a solder resist (not shown) formed on the organic wiring board 11. This step may be omitted depending upon a combination of a solder resist material and an encapsulating resin material or when the surface of the solder resist has been roughened in the previous step or the like.

Next, in step S310, the organic wiring board 11, the IC chip 17, the bonding wires 19, the chip components 15 and the solder 22 are encapsulated through printing encapsulation using a metal mask and a squeegee. At this point, since the contaminants have been removed from the surface of the organic wiring board 11 through the plasma cleaning, the wettability of an encapsulating resin is so increased that the encapsulating resin can be easily filled in a small space, and the adhesiveness between the encapsulating resin and the organic wiring board 11, the IC chip 17 and each chip component 15 is improved.

The printing encapsulation is preferably performed under a reduced pressure. Since the formation of voids in the encapsulating resin can be suppressed under a reduced pressure, the humidity resistance of the electronic component integrated module can be thus improved.

As the resin used in the printing encapsulation, for example, a resin including at least one of an epoxy resin and a silicone resin is used. An epoxy resin including at least one of a bisphenol A type resin, a bisphenol F type resin, a biphenyl type resin and a naphthalene type resin is used as the epoxy resin. Such a resin has a low viscosity, and therefore, even when the content of a filler is increased, the viscosity increase of the resultant encapsulating resin can be suppressed so as to prevent the flowability of the encapsulating resin from lowering. Also, since the content of the filler can be increased, the average linear thermal expansion coefficient of the encapsulating resin can be reduced.

When the content of the filler is increased, the desired characteristics of the resin used in the printing encapsulation cannot be attained as described above, and hence, the content of the filler is preferably not less than 70 wt % and not more than 90 wt %. Also, an inorganic filler such as $Al_2O_3$, MgO, BN, AlN or $SiO_2$ may be used as the filler.

The elastic coefficient of the encapsulating resin 21 at a temperature exceeding the glass transition temperature is preferably not less than 1 MPa and not more than 200 MPa and more preferably not less than 20 MPa and not more than 100 MPa. When the elastic coefficient of the encapsulating resin 21 is small, stress caused on an interface between the chip component 15 and the encapsulating resin 21 during the secondary packaging reflow can be reduced, so as to suppress peeling of the encapsulating resin 21 from the chip component 15.

Furthermore, the encapsulating resin 21 is preferably a resin suitably used in the printing encapsulation. When the resin encapsulation is performed by the printing method, the electronic component integrated module can be easily fabricated at low cost.

As a resin that can be filled in a space between the organic wiring board 11 and the chip component 15 and is suitably used in the printing encapsulation, a resin having, for example, a viscosity not less than 50 Pa·s and not more than 100 Pa·s and a thixotropic ratio not less than 0.8 and not more than 1.5 is preferably used. At this point, the viscosity is obtained 1 minute after starting rotation of 20 rpm with a 7th rotor of a Brookfield 8H type viscometer at 25° C. Also, the thixotropic ratio is obtained by measuring a viscosity 1 minute after starting rotation of 2.5 rpm and dividing this measured viscosity by the above-described viscosity.

Next, in step S311, the encapsulating resin 21 is cured at a temperature of, for example, 150° C. Since the contaminants have been removed from the lower faces of the chip components 15 and the surface of the organic wiring board 11 beneath the chip components 15, the adhesiveness between the encapsulating resin 21 and the chip components 15 or the like is increased, so as to prevent the encapsulating resin 21 from peeling off from the chip components 15.

Furthermore, since the surface of the organic wiring board 11 or the surface of the solder resist formed on the organic wiring board 11 has been roughened through the plasma cleaning, the anchor effect works so as to increase the adhesiveness to the resin and to further suppress the occurrence of the peeling and the like. In this manner, the electronic component integrated module can be completed in step S312.

The present embodiment may be modified as follows:

The wiring board may be a ceramic wiring board instead of the organic wiring board. Also, the chip components are not limited to a capacitor, a resistor and a coil but may be any electronic component to be provided on a wiring board with solder.

Figure 4:
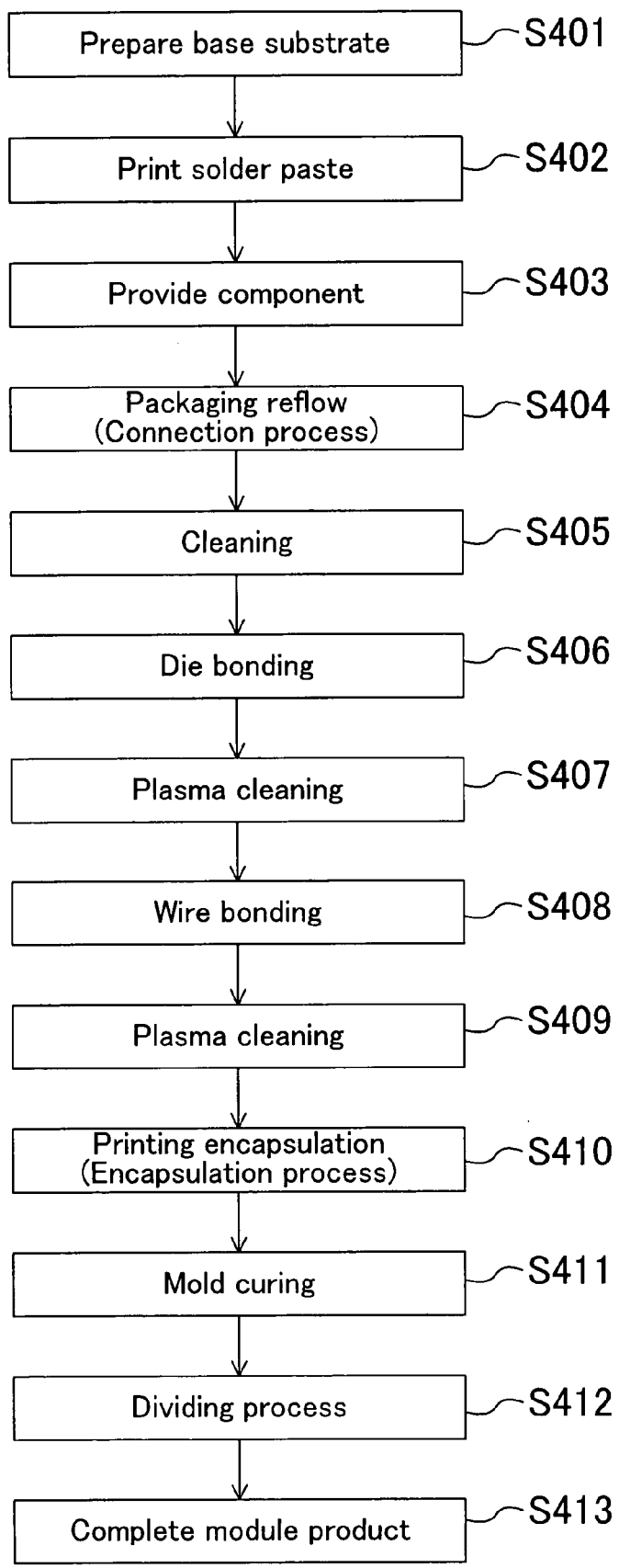
FIG. 4 is a flowchart for showing fabrication procedures for the electronic component integrated module according to a modification of the embodiment.

The electronic component integrated module of this embodiment may be fabricated by a fabrication method shown in a flowchart of FIG. 4.

Specifically, a base substrate is prepared in step S401. At this point, interconnects in a given shape are arranged in the form of a matrix on the base substrate. The base substrate may be made of a resin or ceramic.

Next, procedures of steps S402 through S411 are carried out. In these procedures, the aforementioned procedures of steps S302 through S311 of FIG. 3 are performed in each portion of the base substrate corresponding to an element of the matrix.

Then, the base substrate is divided into respective modules in step S412. In general, the base substrate is cut with a dicing saw or the like. In this manner, a plurality of electronic component integrated modules can be fabricated from one base substrate. Therefore, electronic component integrated modules can be fabricated more efficiently by the fabrication method of FIG. 4 than by the fabrication method of FIG. 3.

What is claimed is:

1. An electronic component integrated module comprising:
   a wiring board;
   an electronic component provided on said wiring board;
   solder for electrically connecting said electronic component onto said wiring board; and
   an encapsulating resin provided on said wiring board for encapsulating said electronic component and said solder, wherein:
   an average linear thermal expansion coefficient α of said encapsulating resin calculated by the following Formula 1 is not less than $17 \times 10^{-6}$/° C. and not more than $110 \times 10^{-6}$/° C.:

$$\alpha = \{\alpha 1 \times (Tg - Tr) + \alpha 2 \times (Tp - Tg)\} / (Tp - Tr), \text{where} \quad \text{Formula 1}$$

α1 indicates a linear thermal expansion coefficient of said encapsulating resin obtained at a temperature lower than a glass transition temperature thereof;
   α2 indicates a linear thermal expansion coefficient of said encapsulating resin obtained at a temperature exceeding the glass transition temperature;
   Tg indicates the glass transition temperature of said encapsulating resin;
   Tr indicates room temperature; and
   Tp indicates a peak temperature of packaging of said electronic component integrated module, and
   the Tg in the Formula 1 is 35° C. or more and 94° C. or less.

2. The electronic component integrated module of claim 1, wherein said electronic component is a surface mount electronic component in the shape of a chip and is at least one of a capacitor, a resistor and a coil.

3. The electronic component integrated module of claim 1, wherein said encapsulating resin includes an inorganic filler, and
   a content of said inorganic filler in said encapsulating resin is not less than 70% and not more than 90% based on a mass thereof.

4. The electronic component integrated module of claim 1, wherein said encapsulating resin has a viscosity not less than 50 Pa·s and not more than 100 Pa·s and has a thixotropic ratio not less than 0.8 and not more than 1.5 at a temperature of 25° C.

5. The electronic component integrated module of claim 1, wherein said encapsulating resin includes at least one of an epoxy resin and a silicone resin.

6. The electronic component integrated module of claim 1, wherein said wiring board is an organic wiring board.

7. The electronic component integrated module of claim 1, wherein said wiring board is a ceramic wiring board.

8. The electronic component integrated module of claim 1, wherein the average linear thermal expansion coefficient α of said encapsulating resin calculated by the Formula 1 is not less than $44 \times 10^{-6}$/° C. and not more than $77 \times 10^{-6}$/° C.

9. The electronic component integrated module of claim 1, wherein the solder covers at least a part of an upper surface of the electronic component.

10. The electronic component integrated module of claim 3, wherein said inorganic filler is at least one of $Al_2O_3$, MgO, BN, AlN and $SiO_2$.

11. The electronic component integrated module of claim 5, wherein:
the encapsulating resin is an epoxy resin, and
the epoxy resin includes at least one of a bisphenol A type resin, a bisphenol F type resin, a biphenyl type resin and a naphthalene type resin.

* * * * *